(12) United States Patent
Roth et al.

(10) Patent No.: US 11,158,448 B2
(45) Date of Patent: Oct. 26, 2021

(54) PACKAGING LAYER INDUCTOR

(71) Applicant: Taiwan Semiconductor Manufacturing Company, Ltd., Hsinchu (TW)

(72) Inventors: Alan Roth, Leander, TX (US); Eric Soenen, Austin, TX (US); Ying-Chih Hsu, Hsinchu (TW); Nick Samra, Austin, TX (US); Stefan Rusu, Sunnyvale, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/008,948

(22) Filed: Jun. 14, 2018

(65) Prior Publication Data
US 2019/0385775 A1 Dec. 19, 2019

(51) Int. Cl.
*H01F 17/00* (2006.01)
*H01F 17/04* (2006.01)
(Continued)

(52) U.S. Cl.
CPC ......... *H01F 17/0006* (2013.01); *H01F 17/04* (2013.01); *H01F 41/046* (2013.01);
(Continued)

(58) Field of Classification Search
CPC .... H01F 17/0006; H01F 17/04; H01F 41/046; H01F 2017/048; H01F 2017/0066; H01F 17/0013; H01L 24/96; H01L 24/97; H01L 2924/19042; H01L 21/568; H01L 2924/14; H01L 23/5385; H01L 23/5383; H01L 2924/19011; H01L 24/16; H01L 24/81; H01L 2224/16265; H01L 2924/19104; H01L 2924/18161; H01L 23/645; H01L 2924/15192; H01L 2924/15313; H01L 2224/81005; H01L 2224/16227; H01L 2924/15311; H01L 24/20; H01L 2924/37001; H01L 2224/04105; H01L 2224/12105; H01L 2224/24137;
(Continued)

(56) References Cited

U.S. PATENT DOCUMENTS 8,740,612 B2 6/2014 Kraus
9,209,131 B2 * 12/2015 Gu ..................... H01L 23/5227
(Continued)

FOREIGN PATENT DOCUMENTS

CN 101494112 A 7/2009
CN 102405524 A 4/2012
(Continued)

OTHER PUBLICATIONS

Office Action Germnan Application No. 10 2018 119 133.2; dated Feb. 13, 2019; 4 pages.

*Primary Examiner* — Su C Kim
(74) *Attorney, Agent, or Firm* — Merchant & Gould P.C.

(57) ABSTRACT

An inductor is formed in an IC device packaging structure. The structure includes an encapsulating material, with a ferromagnetic core in the encapsulation material. A plurality of metal layers are provided in the encapsulation material forming an inductor coil extending around the ferromagnetic core so as to form an inductor.

19 Claims, 7 Drawing Sheets

(51) Int. Cl.
  H01L 23/00 (2006.01)
  H01F 41/04 (2006.01)
  H01L 21/56 (2006.01)
(52) U.S. Cl.
  CPC .............. H01L 24/96 (2013.01); H01L 24/97 (2013.01); *H01F 2017/048* (2013.01); *H01L 21/568* (2013.01); *H01L 2924/14* (2013.01); *H01L 2924/19042* (2013.01)
(58) Field of Classification Search
  CPC ........... H01L 24/19; H01L 2221/68359; H01L 2221/68345; H01L 21/6835; H01L 21/50; H01L 21/56
  See application file for complete search history.

(56) References Cited

U.S. PATENT DOCUMENTS

| | | | |
|---|---|---|---|
| 9,373,605 B1 | 6/2016 | Wang et al. | |
| 2009/0188104 A1* | 7/2009 | Ching | H01F 41/046 29/602.1 |
| 2013/0056847 A1* | 3/2013 | Chen | H01F 17/0013 257/531 |
| 2014/0068932 A1* | 3/2014 | Sturcken | H05K 1/0298 29/832 |
| 2014/0104284 A1 | 4/2014 | Shenoy et al. | |
| 2014/0312458 A1* | 10/2014 | Ashrafzadeh | H01L 23/3121 257/531 |
| 2015/0187488 A1 | 7/2015 | Williams et al. | |
| 2015/0279545 A1 | 10/2015 | Fazelpour et al. | |
| 2016/0071818 A1* | 3/2016 | Wang | H01L 21/76877 257/774 |
| 2016/0233153 A1* | 8/2016 | Kidwell, Jr. | H01L 23/5227 |
| 2017/0125347 A1* | 5/2017 | Hu | H01L 23/49805 |
| 2018/0122772 A1 | 5/2018 | Kim et al. | |

FOREIGN PATENT DOCUMENTS

| | | |
|---|---|---|
| CN | 102446916 A | 5/2012 |
| CN | 107408513 A | 11/2017 |
| JP | 2016-502261 | 1/2016 |
| KR | 10-2016-0138411 | 12/2016 |
| KR | 10-2018-0049336 | 5/2018 |
| WO | 2010/096213 A2 | 8/2010 |

\* cited by examiner

PACKAGING LAYER INDUCTOR

BACKGROUND

Magnetic inductors are used in many electrical applications. For instance, a voltage regulator converts an input voltage to a different output voltage. Power management is a necessary function in a variety of integrated circuit applications. A typical integrated circuit (IC) may include a variety of systems formed by a large number of interconnected components formed on a semiconductor die, and power requirements for such integrated systems can vary widely.

In some voltage regulators, the duty cycle of a switching device determines how much power is output to a load. Pulse width modulation controls the average value of the output voltage. The output of the voltage regulator is connected to an inductor that acts as an energy storage element. Many voltage regulator arrangements are available as ICs, though the inductor is typically a discrete component connected to the power regulator IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
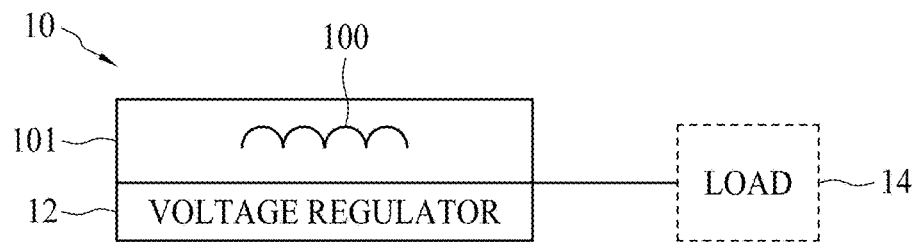
FIG. 1 is a block diagram illustrating aspects of an example of integrated circuit (IC) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which may adversely affect the yield of the packaging.

In some package technologies, dies on a wafer are packaged before they are sawed. This packaging technology has some advantageous features, such as a greater throughput and a lower cost. Further, less under fill or molding compound is needed. However, with this type of packaging technology, the I/O pads of each die are limited to the region directly over the surface of the respective die. The limited areas of the dies, however, limits the number of the I/O pads possible due to the pitch of the I/O pads. If the pitch of the pads is to be decreased, solder regions may bridge with each other, causing circuit failure. Additionally, under the fixed ball-size requirement, solder balls must have a certain size, which in turn limits the number of solder balls that can be packed on the surface of a die.

Integrated fan-out (InFO) packages allow for more I/O pads and solder balls than can be accommodated over the silicon area of a die. With InFO packages, one or more dies are embedded in a packaging material (such as molding compound), and redistribution layers are formed in the packaging material. This allows signals to fan out to regions larger than the silicon area of the die, wherein I/O pads and balls can be redistributed to the fan-out region outside of the silicon die footprint for increased pin count at the package level.

Inductors are required for many electronic circuits. Electronic systems typically include many systems formed by a large number of interconnected components mounted on a substrate, and power requirements for such integrated systems can vary widely. Accordingly, power regulation is necessary to satisfy such varied power requirements. FIG. 1 is a block diagram illustrating an example of an IC device 10 in accordance with aspects of the present disclosure. The example shown in FIG. 1 includes a voltage regulator circuit 12 with an inductor 100 in a package structure 101. In some embodiments, the structure 101 is constructed using InFO packaging techniques. In the voltage regulator 12, the duty cycle of a switching device determines how much power is output to a load 14. Pulse width modulation controls the average value of the output voltage. The output of the voltage regulator is connected to the inductor 100, which acts as an energy storage element.

The inductor 100 is formed in the InFO layers of the IC device 10. Discrete inductors used in some known inductor applications may exceed the footprint required for high performance power management necessary due to higher levels of integration in products. Spiral inductors, typically formed on one or more metal layers, may also suffer from large footprints, and also from large resistance. As such, they may have limited functionality in voltage converters. Air core solenoid inductors may suffer from lower inductor values per area as compared to the magnetically enhanced solenoids.

The inductor 100 formed in the InFO layers of the IC device 10 allows for a lower resistance than similar sized inductors constructed in the back end of line (BEOL) phases of silicon fabrication. Further, some examples of inductors disclosed herein may have a higher inductance per unit area compared to air core inductors. Moreover, disclosed inductors formed in InFO layers reduce magnetic interference caused by embedded inductors located in metal layers of the silicon process, since the inductors are placed farther away from the dense power delivery network of the associated silicon chip.

Figure 2:
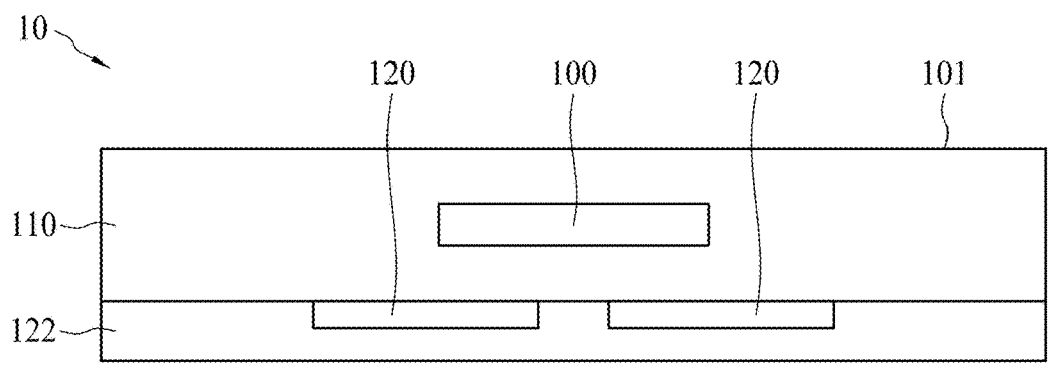
FIG. 2 is a block diagram illustrating an example of a packaging structure including an inductor in accordance with some embodiments.

FIG. 2 is a block diagram illustrating further aspects of an example of the IC device 10. The device 10 includes the inductor 100 which is constructed in a packaging technology such as InFO, such that the inductor 100 is formed and embedded in an encapsulation material 110. The embodiment shown in FIG. 2 has one or more fully fabricated IC chips 120 that implement various electronic circuits, such as the voltage regulator 12. Various layers of the encapsulation material 110 are situated over the IC chips 120. In some embodiments, the IC chips 120 are tested before the packaging process. These IC chips are then surrounded by a molding compound 122 for structural support in accordance with InFO packaging processes.

Figure 3:
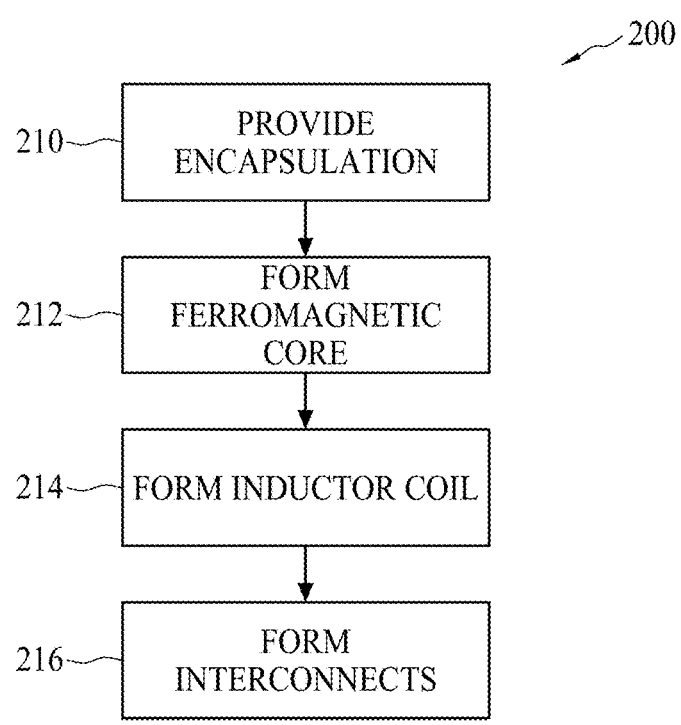
FIG. 3 is a process flow diagram illustrating an example of a method for forming an inductor in a packaging structure in accordance with some embodiments.

FIG. 3 is a flow diagram generally illustrating aspects of an example process 200 for producing the device 10. At block 210, the encapsulating material 110 is provided, and in block 212, a ferromagnetic core is embedded in the encapsulation material 110. At block 214, an inductor coil is formed by a plurality of metal layers in the encapsulation material that extend around the ferromagnetic core so as to form the inductor 100. As discussed further below, in some disclosed examples portions of the inductor coil are formed before the formation of the ferromagnetic core, and in some examples the inductor coil or portions of the inductor coil are formed simultaneously with the ferromagnetic core. Further, at block 216, a plurality of interconnect layers are formed in the encapsulation material, which are configured to couple the inductor 100 to the IC chip(s) 120.

Figure 4:
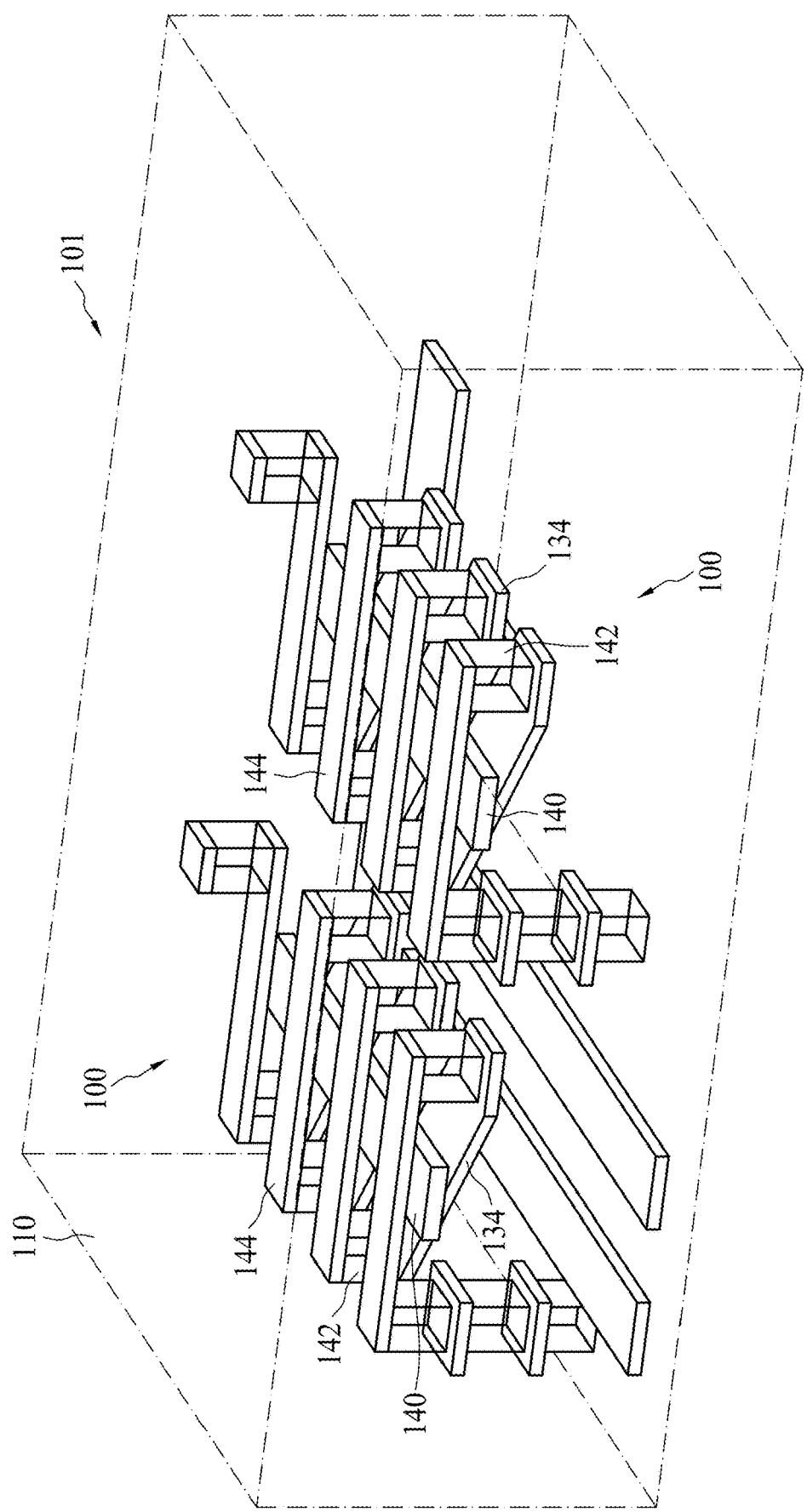
FIG. 4 is a 3D perspective view conceptually illustrating aspects of an example of an inductor formed in an encapsulation material in accordance with some embodiments.

FIG. 4 is a 3D perspective view illustrating further aspects of the inductor 100 formed in the encapsulation material 110. The structure 101 shown in FIG. 3 illustrates examples of two inductors 100 formed in the encapsulation material 110. The inductors 100 each include a ferromagnetic core 140. The metal layers forming the inductor coil include first metal layers 134 situated under the core 140 and second metal layers 144 situated over the core 140. Metal-filled vias 142 are positioned on either side of the core 140 and connect the first and second metal layers 134, 144 to form the inductor coil extending around the core 140.

Figure 5:
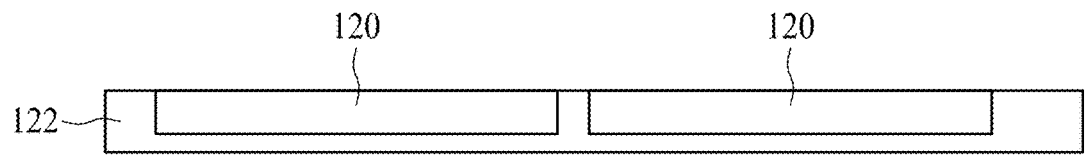
FIGS. 5-11 illustrate an example of a method for forming an inductor in an IC device packaging structure in accordance with some embodiments.

FIGS. 5-11 illustrate an example of a method for making the device structure 10 in accordance with disclosed embodiments, in which the inductor 100 is constructed in a packaging technology such as InFO. In FIG. 5, one or more fully fabricated IC chips 120 are provided, and in subsequent processes various packaging layers are deposited on top of them. In some implementations, the IC chips 120 have been tested and verified as functional before depositing the subsequent layers thereon. The chips 120 are surrounded by a molding compound 122 for structural support. The molding compound 122 may be a polymer-based material, and may include a molding compound, a molding under fill, an epoxy, and/or a resin, for example. In some examples, the top surface of encapsulating material 122 is level with the top ends of IC chips 120 which may be achieved through processes such as Chemical Mechanical Polish (CMP).

Figure 6:
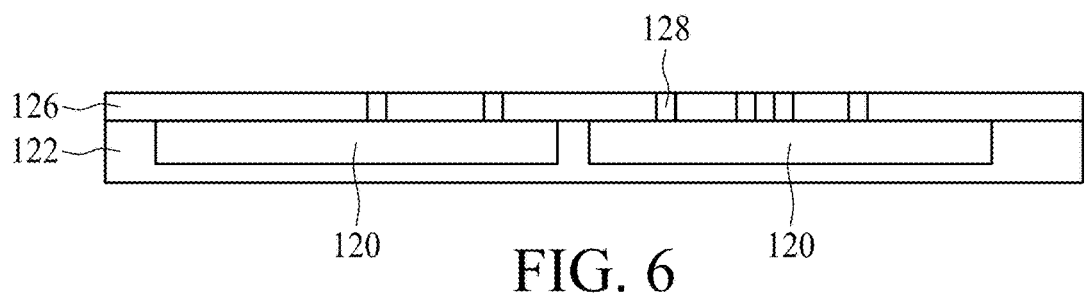

In FIG. 6, a layer of dielectric material 126 is deposited on the molding compound 122 and IC chips 120. Via holes 128 are formed in the dielectric layer 126, and the via holes 128 are filled with metal to provide conductive connections to the IC chips 120. The dielectric layer 126 may be formed of a polymer such as PBO, polyimide, or the like, or alternatively, of an inorganic material such as silicon nitride, silicon oxide, or the like. The dielectric layer 126 may be formed by any acceptable deposition process, such as spin coating, chemical vapor deposition (CVD), laminating, the like, or a combination thereof.

Figure 7:
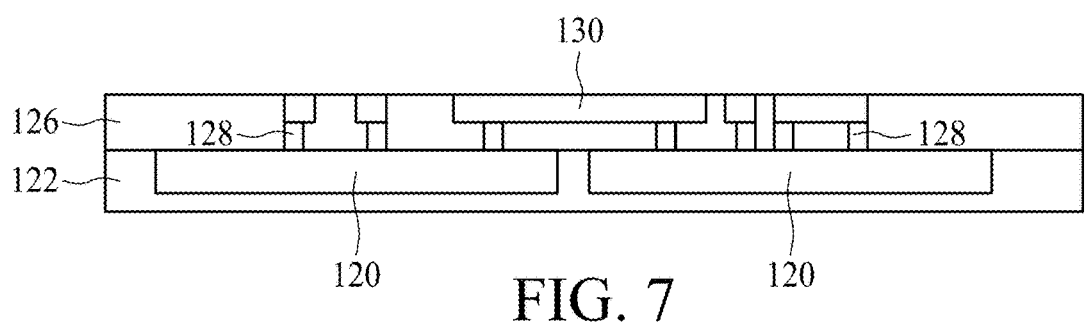

As shown in FIG. 7, the dielectric layer 126 containing the metal-filled vias 128 layer is followed by a package layer metal layer including redistribution lines (RDL) 130. RDLs 130 include metal traces (metal lines) over the dielectric layer 128 and are connected to the vias 128. The RDLs may be formed through dielectric deposition and etching, followed by metal deposition typical to metal layer construction. As an example to form metal lines 130 and vias 128, a seed layer (not shown) is formed over the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the pattern of the RDLs 128, 130. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the RDL vias and lines 128, 130.

Figure 8:
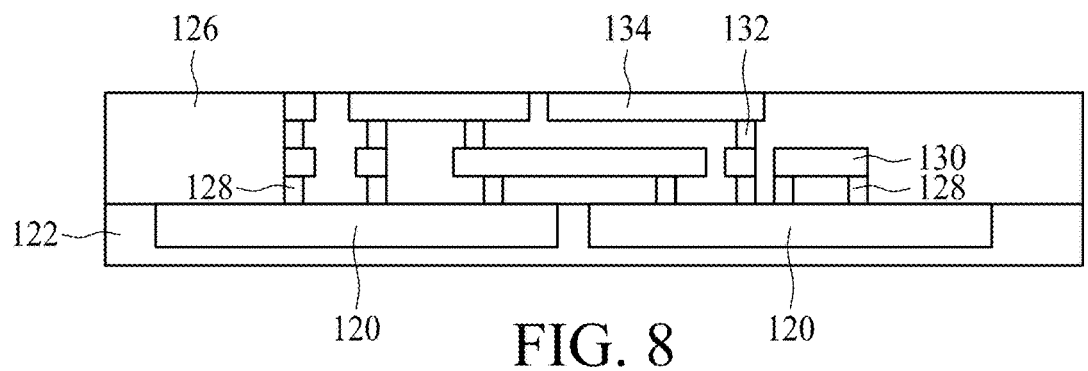

In FIG. 8, the steps described above are essentially repeated to form further metal layers. More particularly, another dielectric layer 126 is formed, and further RDL vias 132 and metal lines 134 are formed. The RDLs 134 shown in FIG. 8 are patterned to form the bottom part of inductor coils embedded in the encapsulating material of the packaging layers of the device 10. Thus, as noted above in conjunction with FIG. 3, portions of the inductor coils are formed before the ferromagnetic core of the inductor is formed.

Figure 9:
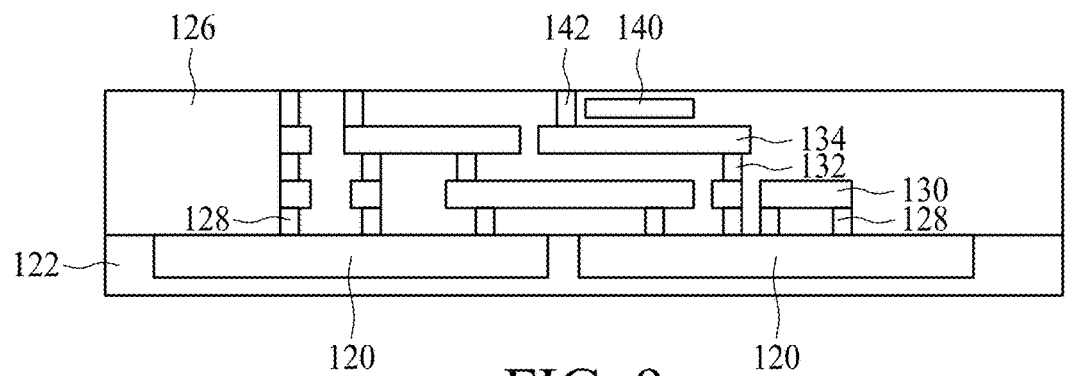

Referring now to FIG. 9, after forming the metal layer 134 that forms the lower part of the inductor coil, another dielectric layer 126 is deposited and a ferromagnetic material 140, such as CZT, is deposited in the manner described above to form the core of the inductor 100. Vias 142 are formed, which are situated generally in parallel with ferromagnetic material 140 forming the inductor core. As such, the vias 142 in this layer form part of the inductor coil along with the metal layers 134. In other words, as noted above in conjunction with FIG. 3, additional portions of the inductor coils are formed simultaneously with the ferromagnetic core of the inductor in the illustrated example.

Figure 10:
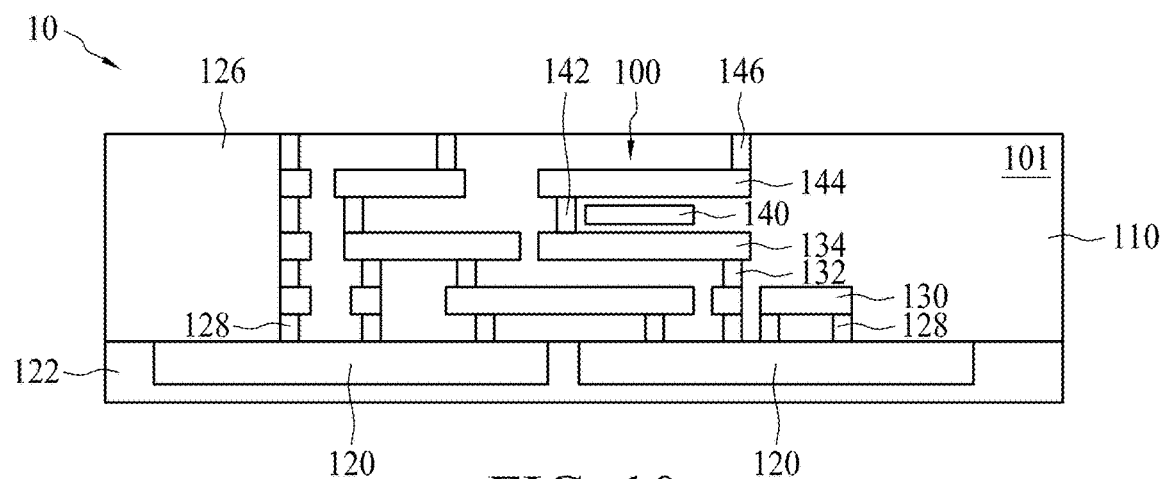

These processes are further repeated, and FIG. 10 shows additional dielectric layers 126, in which another metal layer 144 is deposited that forms the upper part of the inductor 100. Additional vias 146 are formed on top of the metal layer 144 to provide conductive interconnections to the exterior of the structure 101. Thus, FIG. 10 illustrates RDLs including metal lines 130 and vias 128 that provide electrical connections between the IC chips 120 and inductor 100 formed in the encapsulation layer 110. The metal lines 134 and 144 along with the vias 142 form the inductor coil extending around the ferromagnetic inductor core 140, and the vias 146 provide conductive interconnections to the upper surface of the encapsulation 110. Additional metal layers could be added or removed above and/or below the inductor metal layers, and the metal layers used to construct the inductor 100 may also be used for routing or other purposes on sections of structure 101 that do not require inductors.

Figure 11:
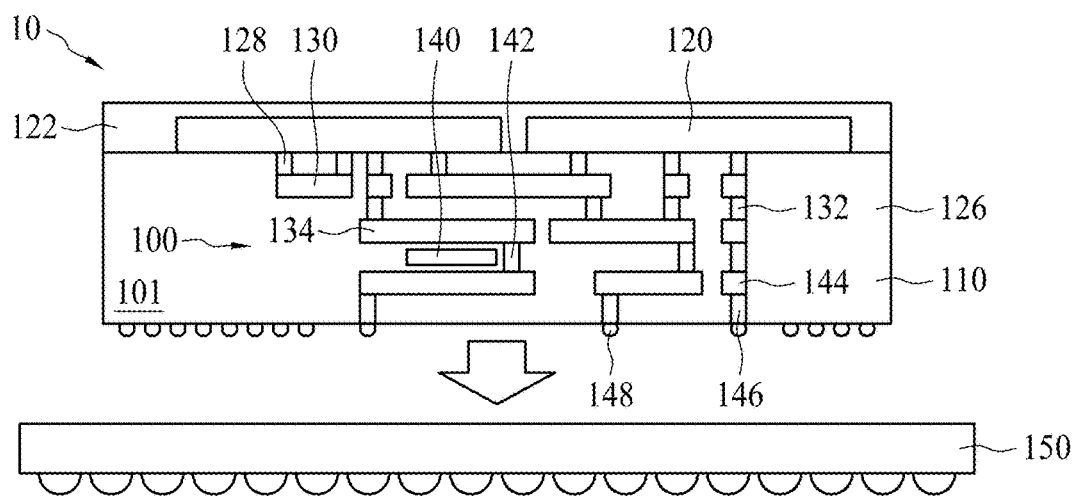

In FIG. 11, conductive connectors 148 are added to the structure 10, which may then be mounted in a package substrate 150. The conductive connectors 148 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In other embodiments, the conductive connectors 148 may be metal pillars (such as a copper pillar) formed by a sputtering, printing, electro plating, electroless plating, CVD, or the like. The metal pillars may be solder free and have substantially vertical sidewalls.

In other examples, the package structure 101 is initially constructed separate from the IC chips 120, such as by a Heterogeneous Device and Module Integration (HDMI) process. The IC chips 120 are then integrated/attached in a separate processing step. In such examples, a reusable carrier is used to build up the packaging structure 101, which is essentially built in the reverse order from the previous disclosed method. FIGS. 12-17 illustrate an example of such a process.

Figure 12:
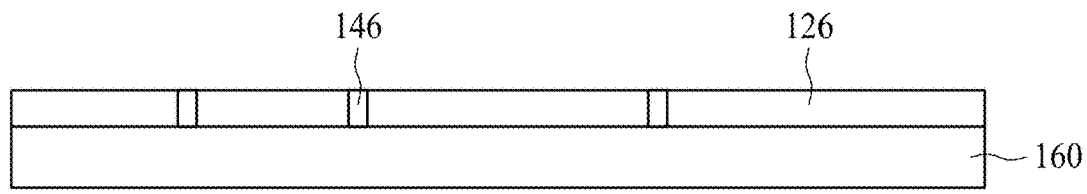
FIGS. 12-17 illustrate another example of a method for forming an inductor in an IC device packaging structure in accordance with some embodiments.

Referring now to FIG. 12, a reusable carrier 160 is provided. In some examples, a release layer (not shown) may be formed on the carrier 160. The reusable carrier 160 may be a glass carrier substrate, a ceramic carrier substrate, or the like. Further, the carrier 160 may be a wafer, such that multiple packages can be formed on the carrier 160 simultaneously. The release layer may be formed of a polymer-based material, which may be removed along with the carrier 160 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier 160, or may be the like.

A layer of the dielectric material 126 described above is deposited on the carrier 160. The dielectric material 126 is then etched to form the vias 146, which are filled with metal. As with the earlier example described above, the dielectric layers 126 referred to in conjunction with FIGS. 12-17 may be formed of a polymer such as PBO, polyimide, or the like, or alternatively, of an inorganic material such as silicon nitride, silicon oxide, or the like. Additionally, the dielectric layers 126 shown in FIGS. 12-17 may be formed by any acceptable deposition process, such as spin coating, CVD, laminating, the like, or a combination thereof. Note that the vias 146 provide the interconnections to the outer surface of the package structure 101 as shown in FIG. 11, since the layers are formed in a reversed order from the process shown in FIGS. 5-10.

Figure 13:
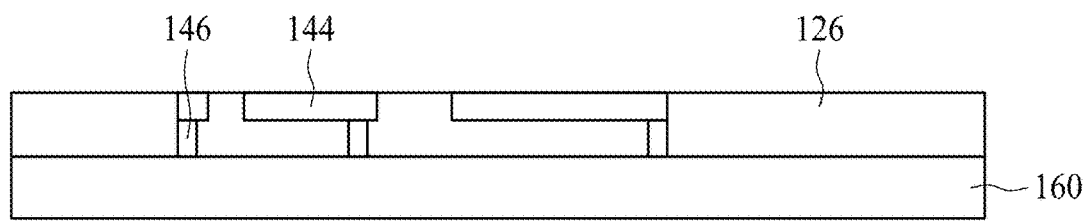

In FIG. 13, a further dielectric layer 126 is deposited, and the metal layer 144 is formed through dielectric deposition and etching followed by metal deposition. The metal layer 144 is patterned to contain the lower part of the inductor 100.

As an example to form the metal layer 144 and other metal features in the dielectric layers, a seed layer (not shown) is formed over the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pattern of the metal layer 144. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metal layer 144.

Figure 14:
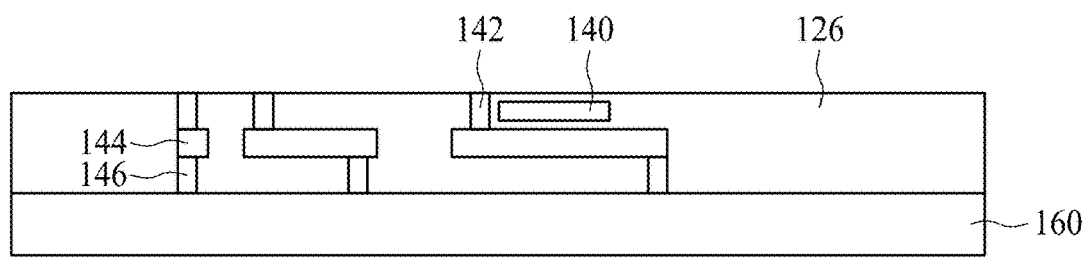
Figure 15:
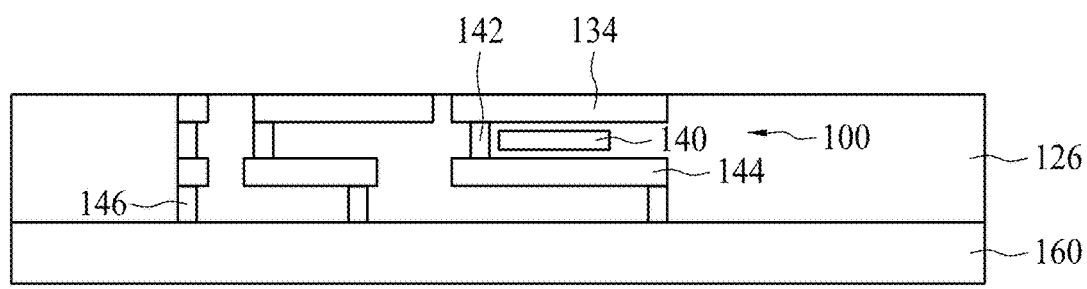

As shown in FIG. 14, another dielectric layer 126 is deposited and the ferromagnetic material 140, such as CZT, is deposited to form the core of the inductor 100. The vias 142 are also formed, which are situated on either side of the deposited ferromagnetic material 140 so as to further form the inductor coil. In FIG. 15, the metal layer 134 is formed, which is connected to the metal layer 144 by the vias 142 to form the inductor coil extending around the ferromagnetic core material 140 to form the inductor 100. The metal layers and vias may be formed in the manner described above.

Figure 16:
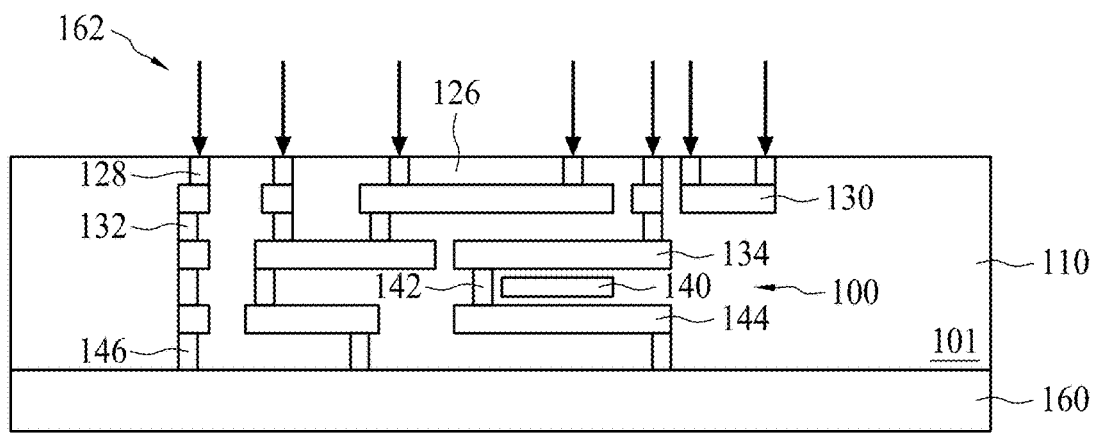

FIG. 16 illustrates the additional non-inductor metal and via layers 132, 130 and 128 in the dielectric layer 126. These RDL layers provide interconnections to the external upper surface of the structure 101 as shown in FIG. 16. In addition to connecting inductor 100 formed in the package structure 101 to the IC chips 120, testing probes 162 may be coupled to these interconnections to test the inductor 100, metal connectors, and other electrical structures formed in the packaging encapsulation 110, prior to connecting the structure 101 to the IC chips 120. The package structure 101 produced according to the process shown in FIGS. 12-16 allows testing the inductor(s) 100, as well as other aspects of the package 100, before being attached to the IC chips 120. This may provide a higher overall product yield, since only packages with working inductors 100 are attached to the IC chips 120.

Figure 17:
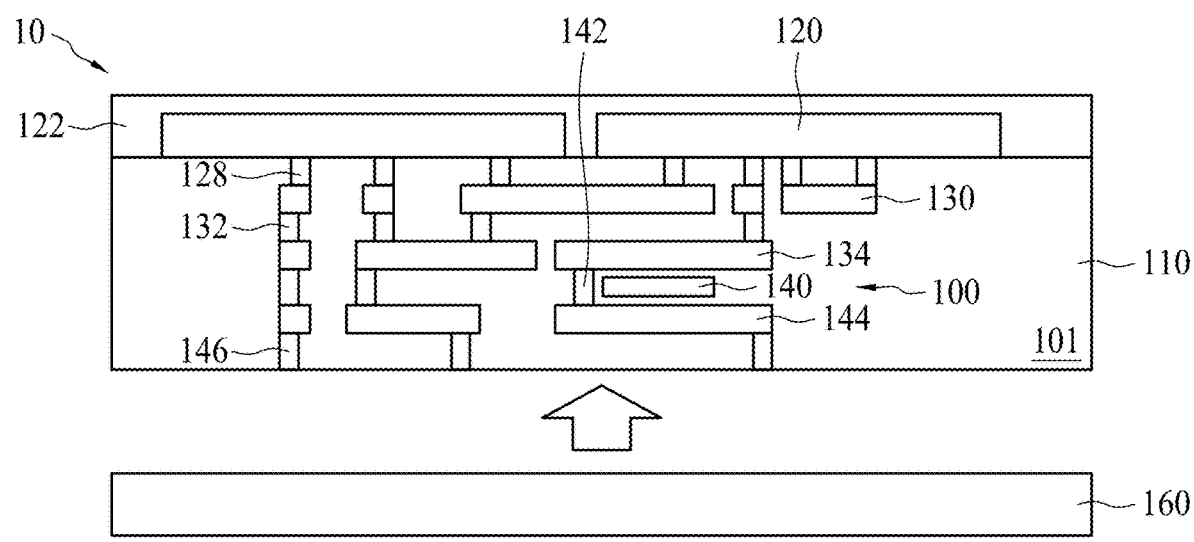

Thus, once the packaging structure 101 is tested, it is attached to one or more IC chips 120, and the carrier 160 is removed as shown in FIG. 17. The chips 120 are surrounded by a molding compound 122 for structural support. The molding compound 122 may be a polymer-based material, and may include a molding compound, a molding under fill, an epoxy, and/or a resin, for example. In some examples, the top surface of encapsulating material 122 is level with the top ends of IC chips 120 which may be achieved through a CMP process, for example. Conductive connectors 148 are added, and the packaging structure 101 containing the inductor 100 embedded in the encapsulation material 110 may then be attached to a package substrate 150 in the manner described above in conjunction with FIG. 11. As with the example discussed above, additional metal layers could be added/removed above/below the metal layers forming the inductor 100. Further, the metal layers used form the inductor 100 can be used for routing or other purposes in sections of the package structure 101 that do not need inductors.

Figure 18:
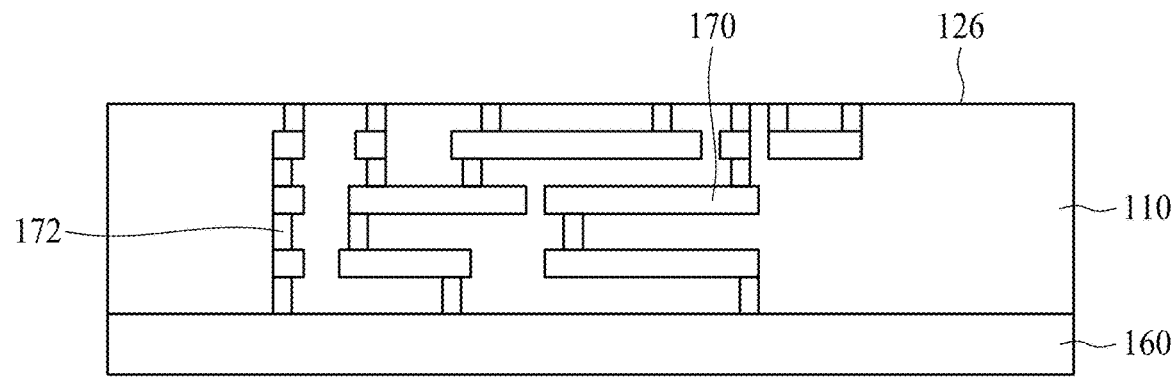
FIGS. 18-20 illustrate a further example of a method for forming an inductor in an IC device packaging structure in accordance with some embodiments.
Figure 19:
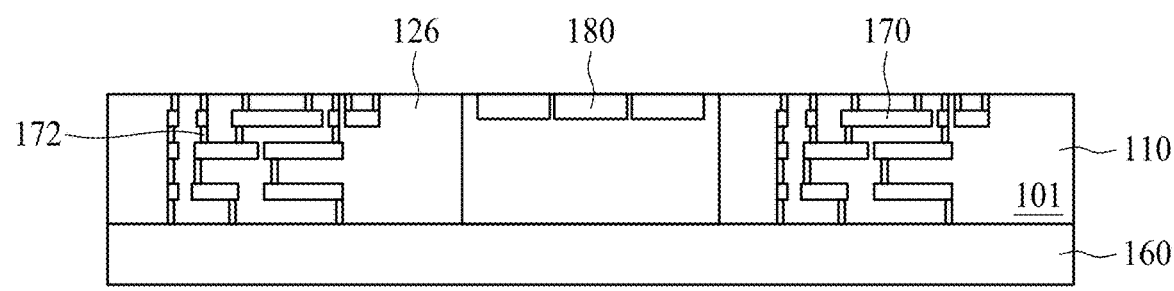
Figure 20:
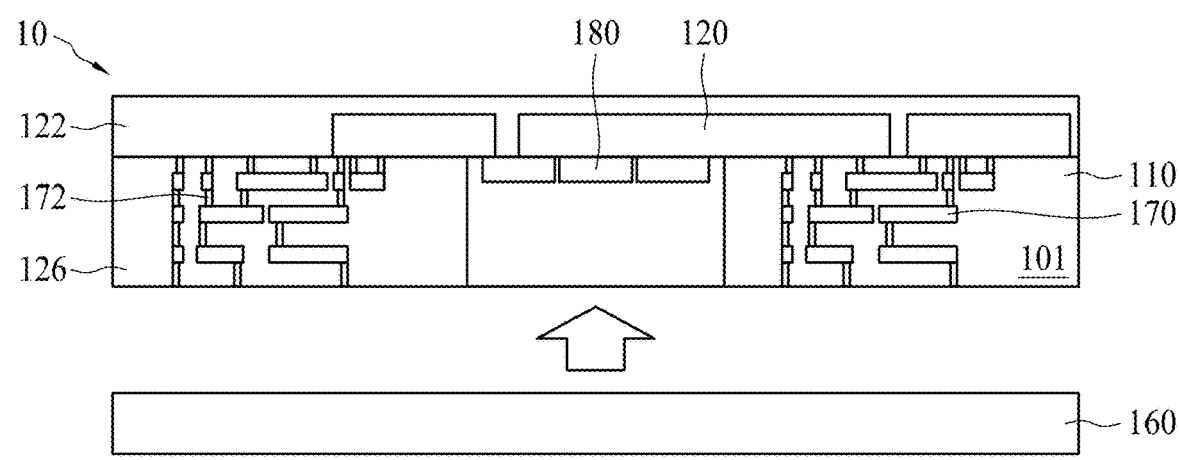

FIGS. 18-20 illustrate another example, where the inductor 100 is implemented as an Integrated Passive Devices (IPD). Such IPD devices may include, for example, an "on-chip" inductor formed by BEOL (back-end-of-line) semiconductor fabrication processes as are well known to those in the art. Moreover, the example disclosed in FIGS. 18 and 19 is initially constructed separate from the IC chips 120, such as an HDMI process. The IC chips 120 are then integrated/attached in a separate processing step.

In FIG. 18, a reusable carrier 160 such as that described above provided. In some examples, a release layer (not shown) may be formed on the carrier 160. The reusable carrier 160 may be a glass carrier substrate, a ceramic carrier substrate, or the like. Further, the carrier 160 may be a wafer, such that multiple packages can be formed on the carrier 160 simultaneously. The release layer may be formed of a polymer-based material, which may be removed along with the carrier 160 from the overlying structures that will be formed in subsequent steps. In some embodiments, the release layer is an epoxy-based thermal-release material, which loses its adhesive property when heated, such as an LTHC release coating. In other embodiments, the release layer may be a UV glue, which loses its adhesive property when exposed to UV lights. The release layer may be dispensed as a liquid and cured, may be a laminate film laminated onto the carrier 160, or may be the like. A plurality of dielectric layers 126 are deposited as disclosed in conjunction with the earlier-disclosed examples. More specifically, the dielectric layers 126 shown in the example of FIGS. 18-20 may be formed of a polymer such as PBO, polyimide, or the like, or alternatively, of an inorganic material such as silicon nitride, silicon oxide, or the like. The dielectric layers 126 shown in FIGS. 18-20 may be formed by any acceptable deposition process, such as spin coating, CVD, laminating, the like, or a combination thereof.

Metal RDL structures, including metal lines 170 and vias 172 are formed in the dielectric encapsulation material 110. In some examples, the metal lines 170 and vias 172 are formed by a process where a seed layer (not shown) is formed over the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pattern of the metal features to be formed. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metal lines 170 and vias 172.

As shown in FIG. 19, these blocks of interconnects 170, 172 are then placed alongside an IPD 180 that was fabricated with inductors. The interconnect structure 170, 172 is connected to the IPD inductor 180, and in some examples, the interconnect structure 170, 172 may be tested before final assembly. Once the packaging structure 101 including the IPD inductor 180 is tested, it is attached to one or more IC chips 120, and the carrier 160 is removed as shown in FIG. 20.

The inductors disclosed herein formed in packaging structures, such as InFO layers, allow for a lower resistance than similar sized inductors. Further, these inductors also have a higher inductance per unit area compared to air core inductors. In addition, disclosed embodiments reduce magnetic interference caused by embedded inductors located in metal layers of the silicon process, since the inductors are placed farther away from the dense power delivery network of the associated silicon chip. Still further, by decoupling the inductor manufacturing from the underlying chip manufacturing, these inductors can be added to chips from many different process generations. This reduces the overall cost of inductor development and adds flexibility to manufacturing.

Disclosed embodiments include an inductor formed in a packaging structure that includes an encapsulating material, with a ferromagnetic core in the encapsulation material. A plurality of metal layers are provided in the encapsulation material forming an inductor coil extending around the ferromagnetic core so as to form an inductor.

In accordance with further disclosed embodiments, a method for forming an inductor includes providing an encapsulating material, embedding a ferromagnetic core in the encapsulation material, and embedding a plurality of metal layers in the encapsulation material extending around the ferromagnetic core so as to form an inductor. A plurality of interconnect layers are further embedded in the encapsulation material, wherein the plurality of interconnect layers are configured to couple the formed inductor to an IC chip.

In accordance with still further disclosed embodiments, a method of forming an inductor includes embedding an IC chip in a molding compound. A first dielectric layer is formed, and a first metal layer is formed in the first dielectric layer. A second dielectric layer is formed over the first dielectric layer, and a ferromagnetic core and a plurality of vias are formed in the second dielectric layer. The vias are situated on first and second sides of the ferromagnetic core. A third dielectric layer is formed over the second dielectric layer, and a second metal layer is formed in the third dielectric layer. The first metal layer, the second metal layer, and the vias are electrically connected to extend around the ferromagnetic core to form an inductor. The IC chip is electrically connected to the inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    an encapsulating material including a top surface and a bottom surface;
    a ferromagnetic core with a first end and a second end opposite the first end in the encapsulation material;
    a plurality of metal layers in the encapsulation material forming an inductor coil extending around the ferromagnetic core so as to form an inductor;
    a plurality of interconnect layers in the encapsulation material;
    a package including a plurality of IC chips, each of the plurality of IC chips spatially separated from all of the other plurality of IC chips and surrounded by a molding compound that provides structural support to the plurality of IC chips,
    wherein a top end of the plurality of IC chips of the package is level with a top surface of the molding compound that surrounds the plurality of IC chips;
    wherein the top end of the plurality of IC chips and the top surface of the molding compound directly contact the bottom surface of the encapsulation material; and
    wherein the plurality of IC chips of the package are coupled to the inductor by the interconnect layers.

2. The structure of claim 1, wherein the encapsulating material comprises:
    a first dielectric layer having a first one of the plurality of metal layers therein;
    a second dielectric layer over the first dielectric layer, the second dielectric layer having the ferromagnetic core therein and defining a plurality of vias on first and second sides of the ferromagnetic core;
    a third dielectric layer over the second dielectric layer and having a second one of the plurality of metal layers therein;
    wherein the plurality of vias electrically connect the first and second metal layers.

3. The structure of claim 1, further comprising:
    a package substrate;
    wherein the encapsulation material is mounted on the package substrate such that the top surface of the encapsulation directly contacts the package substrate.

4. The structure of claim 1, wherein the inductor comprises an integrated passive device (IPD).

5. The structure of claim 1, further comprising conductive connectors on the encapsulation material, wherein the conductive connectors are distributed to an area larger than the area of the plurality of IC chips.

6. A method, comprising:
    providing an encapsulating material, the encapsulation material including a top surface and a bottom surface;
    embedding a ferromagnetic core with a first end and a second end opposite the first end in the encapsulation material;
    embedding a plurality of metal layers in the encapsulation material extending around the ferromagnetic core so as to form an inductor;
    embedding a plurality of interconnect layers in the encapsulation material;
    providing a package including a plurality of IC chips, each of the plurality of IC chips spatially separated from all of the other plurality of IC chips and surrounded by a molding compound that provides structural support to the plurality of IC chips, wherein a top end of the plurality of IC chips of the package is level with a top surface of the molding compound that surrounds the plurality of IC chips and the top end of the plurality of IC chips and the top surface of the molding compound directly contact the bottom surface of the encapsulation material; and
    coupling the inductor to the plurality of IC chips of the package by the plurality of interconnect layers;
    wherein an encapsulation layer is formed over the molding compound.

7. The method of claim 6, further comprising:
    forming a first dielectric layer;
    forming a first one of the plurality of metal layers in the first dielectric layer;
    forming a second dielectric layer over the first dielectric layer;
    forming the ferromagnetic core in the second dielectric layer;
    forming a plurality of vias in the second dielectric layer;
    forming a third dielectric layer over the second dielectric layer;
    forming a second one of the plurality of metal layers in the third dielectric layer; and
    wherein the first metal layer, the second metal layer, and the vias are electrically connected to form an inductor coil extending around the ferromagnetic core.

8. The method of claim 7, wherein embedding the plurality of interconnect layers comprises:
    forming a fourth dielectric layer;
    forming a redistribution metal layer (RDL) in the fourth dielectric layer configured to couple the inductor to the plurality of IC chips.

9. The method of claim 8, further comprising:
providing a package substrate; and
mounting the encapsulation layer onto the package substrate.

10. The method of claim 8, wherein forming a RDL includes forming a seed layer over the fourth dielectric layer.

11. The method of claim 6, further comprising testing the plurality of IC chips before forming the encapsulation layer over the molding compound.

12. The method of claim 6, further comprising:
providing a carrier; and
wherein the encapsulating material is formed on the carrier.

13. The method of claim 12, wherein the plurality of IC chips are connected to the plurality of interconnect layers after forming the inductor embedded in the encapsulating material.

14. The method of claim 13, further comprising separating the encapsulating material from the carrier after connecting the plurality of IC chips to the plurality of interconnect layers.

15. The method of claim 6, further comprising:
forming a plurality of dielectric layers;
forming a plurality of redistribution metal layers (RDL) in the plurality of dielectric layers;
embedding an IPD inductor in the encapsulation material; and
connecting the IPD inductor to the plurality of RDL.

16. The method of claim 6, further comprising testing the inductor before forming the encapsulation layer over the molding compound.

17. The method of claim 6, further comprising leveling the first side of each of the plurality of IC chips of the package with the top surface of the molding compound by a Chemical Mechanical Polish process before coupling the inductor to the plurality of IC chips of the package by the plurality of interconnect layers.

18. A method, comprising:
embedding a plurality of IC chips in a molding compound that provides support to the plurality of IC chips to form a package, wherein each of the plurality of IC chips is spatially separated from all of the other plurality of IC chips and wherein a top end of each of the plurality of IC chips is level with a top surface of the molding compound that surrounds the plurality of IC chips;
forming a first dielectric layer, wherein the first dielectric layer includes a top surface and a bottom surface;
forming a first metal layer in the first dielectric layer;
forming a second dielectric layer over the first dielectric layer;
forming a ferromagnetic core with a first end and a second end opposite the first end and a plurality of vias in the second dielectric layer, wherein the vias are situated on first and second sides of the ferromagnetic core;
forming a third dielectric layer over the second dielectric layer;
forming a second metal layer in the third dielectric layer, wherein the first metal layer, the second metal layer, and the vias are electrically connected to extend around the ferromagnetic core and form an inductor; and
electrically connecting the IC chips to the inductor;
wherein the first dielectric layer is formed over the molding compound and the top ends of the plurality of IC chips and the top surface of the molding compound directly contact the bottom surface of the first dielectric layer.

19. The method of claim 18, wherein the first sides of each of the plurality of IC chips embedded in the molding compound are attached to the first dielectric layer after the inductor is formed.

* * * * *